United States Patent [19]

Kosinski et al.

[11] Patent Number: 5,422,533
[45] Date of Patent: Jun. 6, 1995

[54] PIEZOELECTRIC RESONATOR

[75] Inventors: John A. Kosinski, Wall Township, Monmouth County; Yicheng Lu, Highland Park, both of N.J.

[73] Assignee: The United States of America as represented by the Secretary of the Army, Washington, D.C.

[21] Appl. No.: 208,770

[22] Filed: Mar. 9, 1994

[51] Int. Cl.6 .............................................. H01L 41/08
[52] U.S. Cl. ...................................... 310/335; 310/311
[58] Field of Search ............... 310/322, 311, 334, 360, 310/335

[56] References Cited

U.S. PATENT DOCUMENTS

| | | | |
|---|---|---|---|
| 3,626,257 | 12/1971 | Esaki et al. | 257/15 |
| 3,626,328 | 12/1971 | Esaki et al. | 331/107 G |
| 3,691,476 | 9/1972 | Hayashi | 372/45 |
| 3,915,765 | 10/1975 | Cho et al. | 437/107 |
| 3,982,207 | 9/1976 | Dingle et al. | 372/45 |
| 4,088,515 | 5/1978 | Blakeslee et al. | 111/91 |
| 4,163,238 | 7/1979 | Esaki et al. | 357/17 |
| 4,166,967 | 9/1979 | Benes et al. | 310/338 |
| 4,205,329 | 5/1980 | Dingle et al. | 357/16 |
| 4,205,331 | 5/1980 | Esaki et al. | 357/30 |
| 4,348,686 | 9/1982 | Esaki et al. | 357/30 |
| 4,427,913 | 1/1984 | Iafrate et al. | 310/334 |

Primary Examiner—Thomas M. Dougherty
Attorney, Agent, or Firm—Michael Zelenka; William H. Anderson

[57] ABSTRACT

A piezoelectric resonator for use with microwave monolithic integrated circuit (MMIC) devices which are fabricated on (100) GaAs (gallium arsenide) material is provided. This resonator has a central resonator flat portion composed of (100) GaAs material and has a distributed reflector on each side of the flat portion with each reflector having an alternating series of layers, including a first layer having doped regions and an uppermost layer composed of the (100) GaAs material.

7 Claims, 3 Drawing Sheets

LEGEND
- - - - - FIRST LOWER DOPING LEVEL OUTLINES OR PATTERNS 128, 130
───── SECOND UPPER DOPING LEVEL PATTERNS 132, 134
─·─·─ PASSAGE HOLE PATTERNS 136, 138, 140, 142
─··─··─ BUSBAR METALLIZATION PATTERNS 144, 146

PIEZOELECTRIC RESONATOR

GOVERNMENT INTEREST

The invention described herein may be manufactured, used and licensed by or for the Government for governmental purposes without the payment to us of any royalties thereon.

FIELD OF THE INVENTION

The invention described herein generally relates to a piezoelectric resonator, and in particular the invention relates to a piezoelectric resonator, which is compatible with a microwave monolithic integrated circuit (MMIC) and which is excited by transverse excitation from doped regions.

BACKGROUND OF THE INVENTION

A prior art piezoelectric filter structure is described in U.S. Pat. No. 4,427,913, issued Jan. 24, 1984 to Iafrate et al. The prior art piezoelectric filter structure includes a substrate of bulk gallium arsenide and two supported epitaxially grown layered structures, one layered structure on each side of the substrate, each layered structure having an epitaxially grown first layer of AlGaAs (aluminum gallium arsenide) and an epitaxially grown second layer of GaAs (gallium arsenide) and an epitaxially grown third layer of AlGaAs, and epitaxially grown fourth layer of GaAs, and the filter structure includes electrical transducer means mounted on each epitaxially grown fourth layer of GaAs.

One problem with the prior art structures is that it requires free major surfaces, which are difficult to make in a microresonator.

Another problem with the prior art structure is that, without the transducer means mounted on the outer layers, it cannot use (100) GaAs material, which is a principal material used in MMIC circuits.

One object of the present invention is to provide a resonator structure for a MMIC circuit which does not require free major surfaces.

Another object of the invention is to use the (100) GaAs material in a resonator structure which does not require external transducers means and matches this same material that is used in a MMIC circuit.

SUMMARY OF THE INVENTION

According to the present invention, a resonator is provided. This resonator is used for frequency control and selection in MMIC filters, oscillators, transceivers, and the like. This resonator is fabricated on a (100) GaAs wafer and includes a cavity resonator portion consisting of (100) GaAs (gallium arsenide) material and includes upper and lower distributed reflectors, the reflectors being disposed above and below the cavity resonator portion, each reflector consisting of a first layer of (100) AlGaAs (aluminum gallium arsenide) material disposed adjacent to the cavity resonator portion, said first layer having at least one doped portion, a second layer of (100) GaAs (gallium arsenide) material disposed adjacent to the first layer, a third layer of (100) AlGaAs material disposed adjacent to the second layer, and a fourth layer of (100) GaAs material disposed adjacent to the third layer, and so forth. The uppermost layer is a (100) GaAs epi-layer as desired for MMIC fabrication.

By using distributed reflectors above and below the cavity resonator, the problem of requiring free surfaces in the prior art resonator is avoided.

By using doped portions in the first layer which provide transverse excitation, the problem of not being able to use (100) GaAs material without external transducers in the prior art resonator is avoided.

BRIEF DESCRIPTION OF THE DRAWINGS

The foregoing and other objects, features and advantages will be apparent from the following description of the preferred embodiment of the invention as illustrated in the accompanying drawings.

DESCRIPTION OF THE PREFERRED EMBODIMENTS

Figure 1:
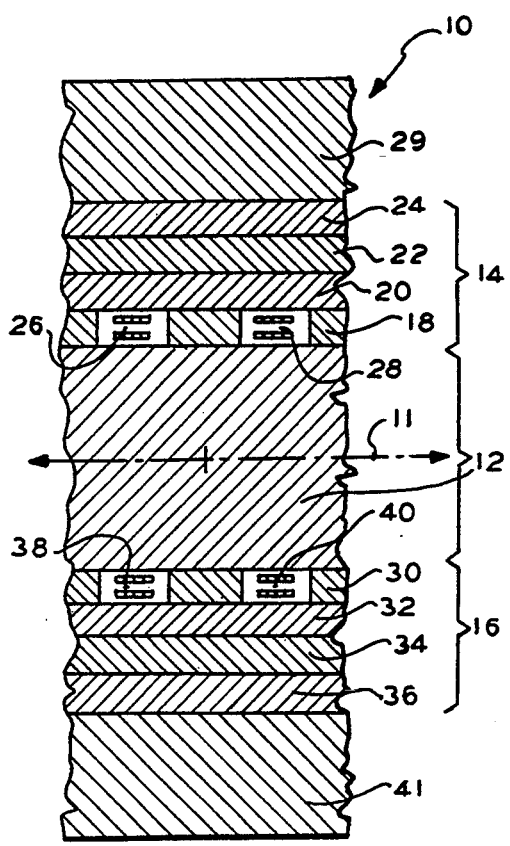
FIG. 1 is a sectional view of a first embodiment of a resonator structure according to the invention.

As shown in FIG. 1, a buried piezoelectric resonator assembly or structure or acoustic diffraction grating or piezoelectric superlattice device or piezo-microresonator assembly 10 is provided. Assembly 10 is compatible with a microwave monolithic integrated circuit (MMIC) device. Assembly 10 has a lateral direction reference line 11.

Assembly 10 has a cavity resonator portion 12 which is composed of (100) GaAs (gallium arsenide) material 12, and has upper and lower distributed reflectors or acoustic superlattices 14, 16. Reflectors 14, 16 are multilayered structures which are disposed above and below resonator portion 12.

Upper reflector 14 has a series of epitaxially grown layers here illustrated as four layers 18, 20, 22, 24. Upper reflector 14 includes first layer 18 which is composed of (100) $Al_{0.25}Ga_{0.75}As$ (aluminum gallium arsenide) material, and includes second layer 20 which is composed of (100) GaAs (gallium arsenide) material. Upper reflector 14 also includes third layer 22 which is composed of (100) $Al_{0.25}Ga_{0.75}As$ material, and includes fourth layer 24 which is composed of (100) GaAs material. First layer 18 has a plurality of doped regions or portions 26, 28. An uppermost layer 29, which is a (100) GaAs epi-layer, is a substrate for the MMIC fabrication.

Lower Reflector 16 includes a series of epitaxially grown layers here illustrated as four layers 30, 32, 34, 36. Lower reflector 16 includes first epitaxially grown layer 30 which is composed of (100) $Al_{0.25}Ga_{0.75}As$ material and which is disposed adjacent to resonator portion 12, and includes a second epitaxially grown layer 32 which is composed of (100) GaAs material. Reflector 16 also includes third epitaxially grown layer 34 which is composed of (100) $Al_{0.25}Ga_{0.75}As$ material, and includes fourth epitaxially grown layer 36 which is composed of (100) GaAs material. First layer 30 has doped regions or portions 38, 40. A (100) GaAs wafer 41 is a host substrate of assembly 10. Wafer 41 acts as a substrate upon which the entire structure is grown epitaxially.

Thus, buried resonator assembly 10 comprises resonator portion 12 and upper and lower distributed reflectors 14, 16, each reflector 14, 16 consisting of one-quarter ($\frac{1}{4}$) acoustic wavelength layers 18, 20, 22, 24 and 30, 32, 34, 36 respectively, composed of alternate materials 20, 24 and 32, 34 with the layer 18, 30 adjacent to the resonator portion 12 containing conductively doped regions 26, 28 and 38, 40.

The buried piezo-microresonator 10 combines a variety of physical principles in its operation:

A) The cavity resonator portion 12 is an acoustic resonator with a thickness corresponding to a $$t \approx n \frac{\lambda}{2}$$

where n is an odd integer and $\lambda$ is the acoustic wavelength. In the device 10 as described here, thickness-shear waves are propagated in the cavity and reflected by the distributed reflectors leading to standing waves.

B) The doped regions 26, 28, 38, 40 are used to provide lateral-field excitation of the thickness shear acoustic waves. This is important since the (100) direction of GaAs is piezoelectrically inactive for thickness directed excitation fields. Thus, the doped regions must be carefully formed to achieve the necessary excitation.

C) The alternating layers 20, 22 and 32, 34 of the reflectors 14, 16 are approximately $$\frac{1}{4} \lambda$$

thick, and are undoped, high resistivity non-conducting layers. These layers will form a Fabry-Perot reflector, with a fraction of the acoustic wave being reflected at each interface. The reflection coefficient of each interface and effective reflection center of each distributed reflecting electrode are readily calculable from the material properties. The total number of layers in each distributed reflecting electrode is chosen based on the desired level of energy confinement in the structure, with greater numbers of layers increasing the confinement and reducing the sensitivity to conditions at the surface of the outermost layer.

Figure 2:
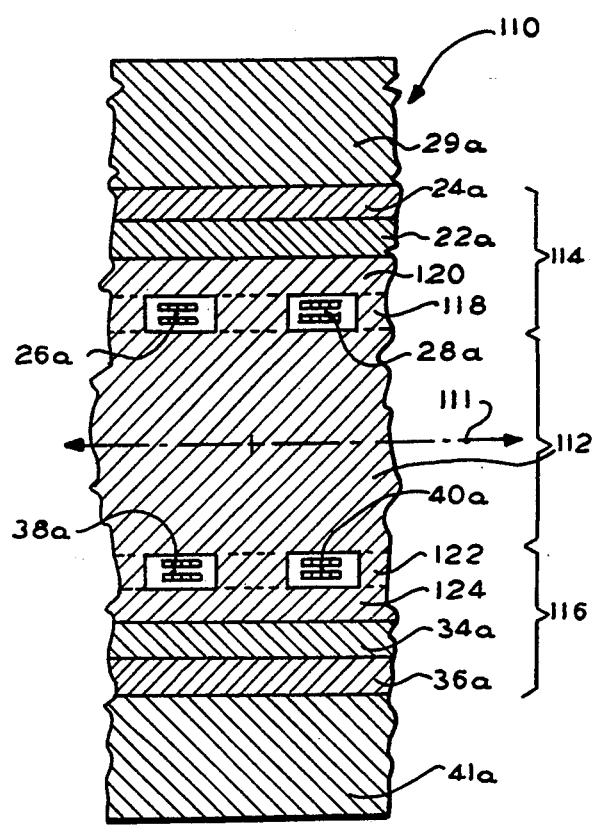
FIG. 2 is a sectional view of a second embodiment of a resonator structure according to the invention.

As shown in FIG. 2, a second embodiment 110 is provided. Parts of second embodiment 110, which are similar to corresponding parts of first embodiment 10, have the same numerals but with a subscript "a" added thereto. Assembly 110 includes a resonator portion 112, and includes a reference lateral direction line 111. Assembly 110 includes an upper reflector 114 and a lower reflector 116. Resonator portion 112 is composed of (100) GaAs material.

Upper reflector 114 includes a first layer or added thickness 118 of (100) GaAs material, and includes a second layer or added thickness 120 of (100) GaAs material. Upper reflector 114 also includes a third epitaxially grown layer 22a of (100) Al$_{0.25}$Ga$_{0.75}$As, and includes a fourth epitaxially grown layer 24a of (100) GaAs. First layer 118 has two doped regions 26a, 28a. An uppermost layer 29a, which is a (100) GaAs epi-layer, is a substrate for the MMIC fabrication.

The thickness dimensions of resonator portion 112 and of layer 120 may be adjusted to assure maximum coupling of energy into resonator portion 112, as well as coincidence of the resonator frequency and the distributed reflector stopband.

Lower reflector 116 has a first layer or added thickness 122, which is composed of (100) GaAs material.

Lower reflector 116 also has a second layer or added thickness 124 of (100) GaAs material. Bottom electrode 116 also has a third epitaxially grown layer 34a of (100) Al$_{0.25}$Ga$_{0.75}$As material, and has a fourth epitaxially grown layer 36a of (100) GaAs material. First layer 122 has doped portions 38a, 40a. A (100) GaAs wafer 41a is a host substrate of assembly 10. Wafer 41a acts as a substrate upon which the entire structure is grown epitaxially.

Figure 3:
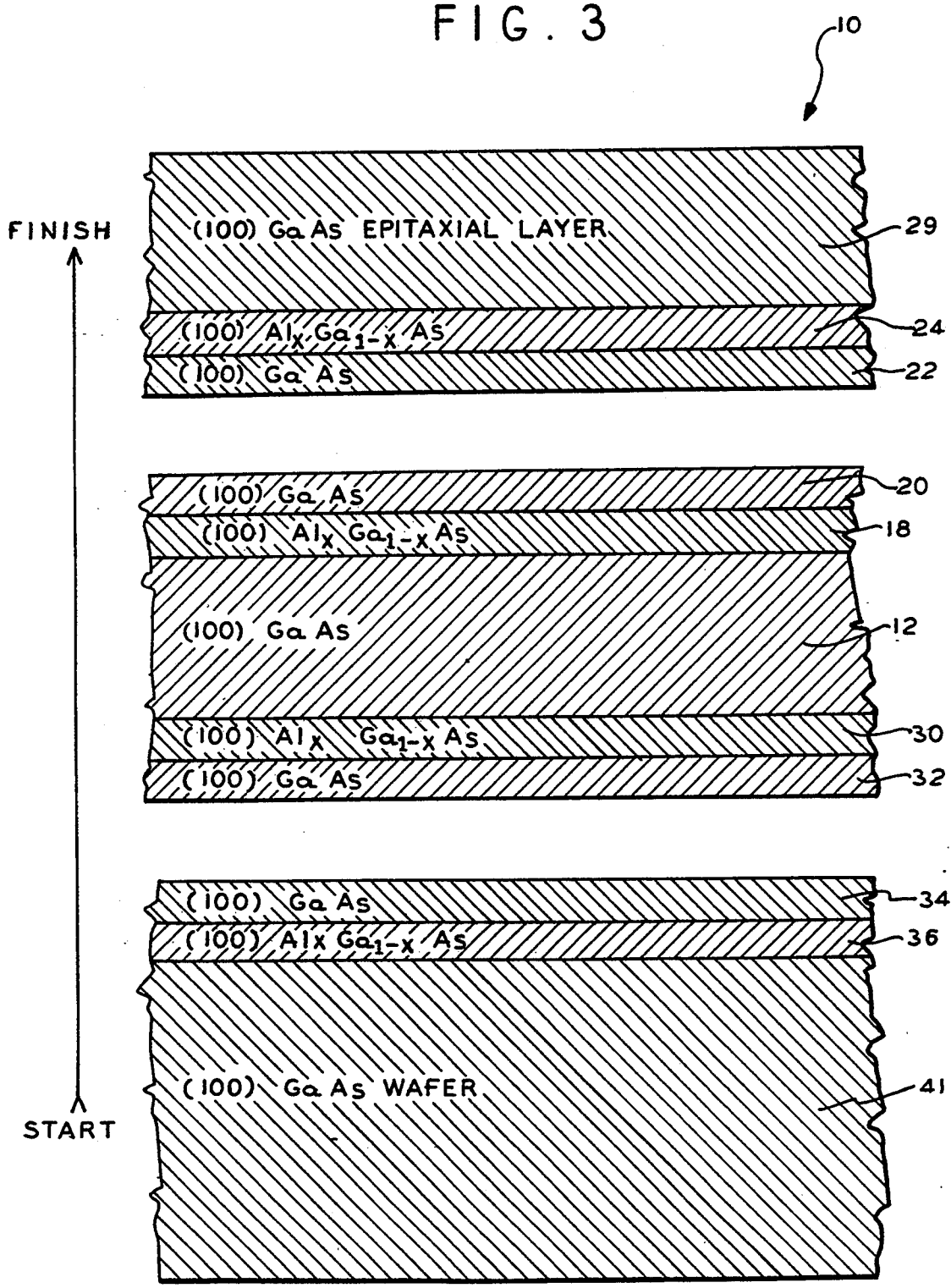
FIG. 3 is a representation of a process of making the first embodiment.

As shown in FIG. 3, there is a sequence of steps in the method of fabrication, or process of manufacture, of assembly 10. This sequence of steps is indicated hereafter.

1. Fabrication begins with (100) GaAs wafer 41, which acts as the substrate upon which the entire structure is grown epitaxially.
2. Grow alternating Al$_x$Ga$_{1-x}$As and GaAs epitaxial layers 36, 34 to form lower distributed reflector 36, 34.
3. Grow lower excitation level 30, 32.
4. Dope lower excitation level 30, 32.
5. Grow GaAs resonator layer 12 which is a high resistivity layer that acts as an acoustic resonator.
6. Grow upper excitation level 18, 20.
7. Dope upper excitation level 18, 20.
8. Grow alternating Al$_x$Ga$_{1-x}$As and GaAs epitaxial layers 22, 24 to form an upper distributed reflector 22, 24.
9. Grow GaAs epi-layer 29 upon which MMIC will be based.
10. Open via-holes or passage holes 136, 138, 140, 142 (see FIG. 5).
11. Metallize via-hole contacts to doped regions and busbars 144, 146.

Figure 4:
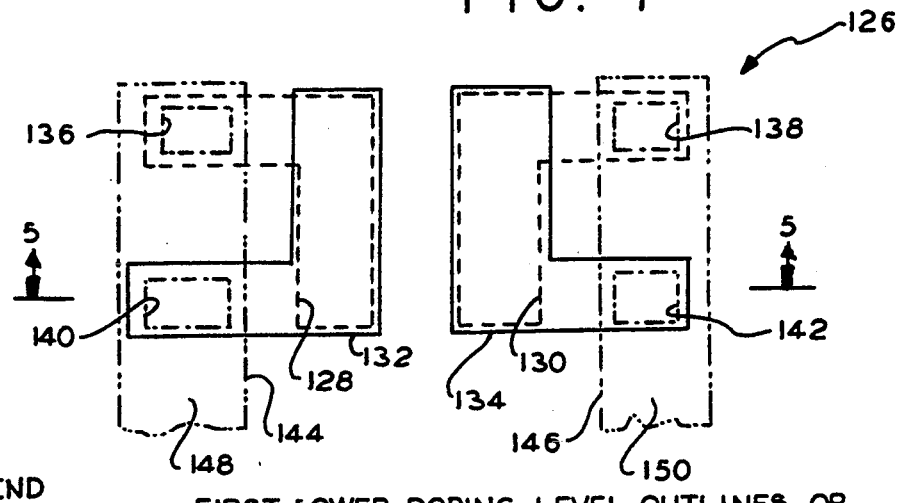
FIG. 4 is a top view of the first embodiment during manfacture.
Figure 5:
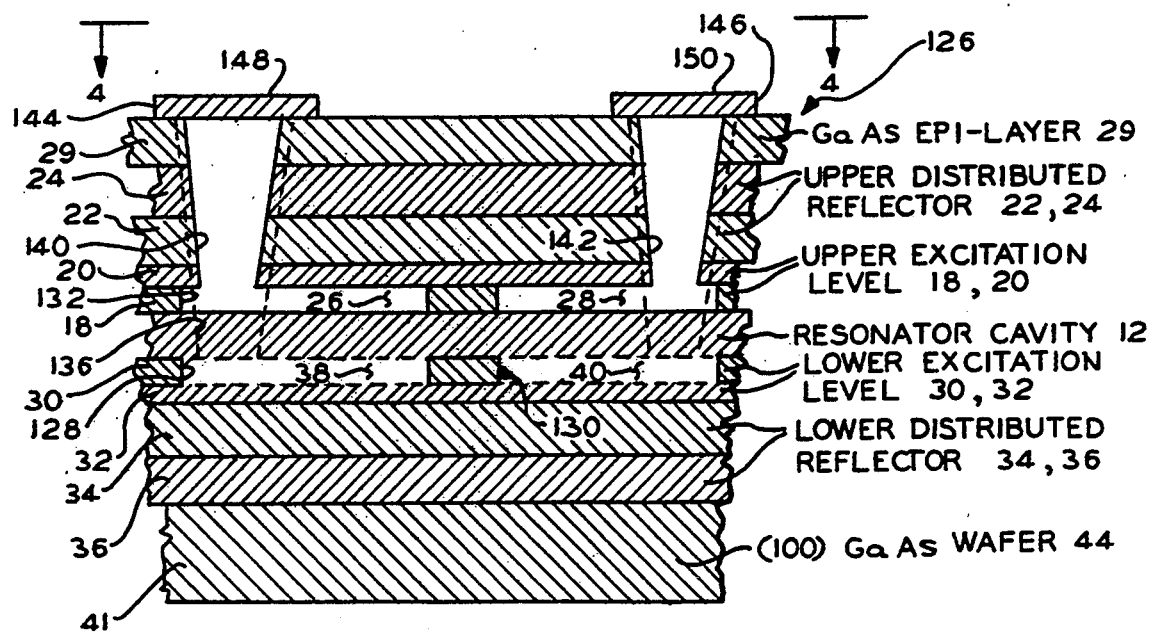
FIG. 5 is a sectional view as taken along the line 5—5 of FIG. 4.

FIG. 4 shows a schematic top view, or a process layout of assembly 10 which is assembly 126 during manufacture. FIG. 5, which shows a sectional view of assembly 126 of FIG. 4, corresponds to the sectional view of assembly 10 of FIG. 1. As shown in FIGS. 4 and 5, assembly 126 shows first or lower doping level outlines or patterns 128, 130 of the respective lower doped regions or portions 38, 40. Assembly 126 also shows second or upper doping level patterns 132, 134 of respective upper doped portions 26, 28. Assembly 126 also shows passage hole patterns 136, 138 to respective doped portions 38, 40, and shows passage hole patterns 140, 142 to respective doped portions 26, 28. Assembly 126 also has busbar metallization patterns 144, 146 and respective busbars 148, 150. For ease of illustration, FIG. 4 shows a legend and shows distinctive lines, as used to depict outlines or patterns at different levels. In the process of manufacture, a metallization of busbars 148, 150 causes a filling of the holes of patterns 136, 138, 140, 142. The filled metal in such holes forms contacts (not shown) to the doped portions 26, 28, 38, 40, and to the busbars 148, 150. In this way, the contacts and the doped regions or portions 26, 28, 38, 40 are carefully formed, to achieve the necessary excitation.

The advantages of resonator assembly 10, 110 are indicated hereafter.

A) Assembly 10 uses normally piezo-inactive (100) GaAs material which is a preferred material used in MMIC circuits.

B) Reflectors 14, 16 allow assembly 10, 110 to be a buried assembly.

C) Assembly 10, 110 eliminates the need to have both upper and lower free surfaces which are otherwise difficult to fabricate.

D) Assembly 10, 110 is relatively insensitive to changes at the surfaces above assembly 10, 110, thereby eliminating the need for vacuum packaging and contamination prevention during manufacture thereof.

E) Assembly 10, 110 is easily joined to adjacent devices or circuit components which can be fabricated directly on the uppermost layers, 24, 24a, thereby facilitating improved miniaturization.

F) Assembly 10, 110 avoids the need for subsequent manufacturing steps as required in the prior art assembly.

While the invention has been described in its preferred embodiment, it is to be understood that the words which have been used are words of description rather than limitation and that changes may be made within the purview of the appended claims without departing from the true scope and spirit of the invention in its broader aspects.

For example, doped regions, 38, 40 can be deleted, so that only doped regions 26, 28 are used whereby assembly 10 has doped regions only on one side of resonator portion 12.

As another example, the thickness of resonator portion 12 or the thickness of doped layer 18, 30 can be varied from their respective nominal values of $$t = n\frac{\lambda}{2} \text{ and } t = \frac{\lambda}{4},$$

in order to guarantee that the resonator frequency and the distributed reflector stop band coincide.

As another example, the composition of the $Al_{0.2}Ga_{1-\chi}As$ layers may be varied from the preferred value of $=0.25$ within the range of $0 < \chi \leq 1$.

As yet another example, the cavity resonator portion may be comprised of the $Al_\chi Ga_{1-\chi}As$ material.

What is claimed is:

1. A buried resonator fabricated on a (100) GaAs substrate and comprising:
   a cavity resonator portion consisting of (100) GaAs (gallium arsenide) material; and
   upper and lower distributed reflectors disposed above and below the cavity resonator portion;
   each reflector including:
   an alternating series of layers including a first layer and an uppermost layer and consisting of either (100) $Al_\chi Ga_{1-\chi}As$ (aluminum gallium arsenide) material with a value of x between 0 and 1.0 or (100) GaAs material;
   said first layer of each reflector being disposed next to the cavity resonator portion and consisting of $Al_\chi Ga_{1-\chi}As$ material;
   said uppermost layer of each reflector consisting of (100) GaAs material suitable to act as a basis for MMIC fabrication; and
   at least one of said reflectors having at least one doped portion in its first layer.

2. The resonator of claim 1, wherein the (100) $Al_\chi Ga_{1-\chi}As$ material is (100) $Al_{0.25}Ga_{0.75}As$ material.

3. The resonator of claim 2, wherein the cavity resonator portion has a thickness (t) according to the formula:

$$t = n\frac{\lambda}{2}$$

where:
n is an odd integer, and
$\lambda$ is the acoustic wavelength of the standing wave in the resonator portion.

4. The resonator of claim 3, wherein the alternating layers each have a thickness (t) according to the formula:

$$t = \frac{1}{4}\lambda$$

where:
$\lambda$ is the acoustic wavelength of the standing wave in the resonator portion.

5. The resonator of claim 4, wherein the thicknesses of the resonator portion and alternating layers deviate slightly from the exact expressions given, and said thicknesses are modified and are chosen to guarantee coincidence of the resonator frequency and reflector stop band.

6. The resonator of claim 1, wherein each of the distributed reflectors contains doped regions.

7. The resonator of claim 1, wherein the cavity resonator portion consists of either $Al_\chi Ga_{1-\chi}As$ material or (100) GaAs material.

* * * * *